Aug. 19, 1958 W. L. FREIENMUTH 2,848,610

OSCILLATOR FREQUENCY CONTROL APPARATUS

Filed May 25, 1953

INVENTOR.
WILLIAM LELAND FREIENMUTH
BY
Theodore C. Jay Jr.
AGENT

United States Patent Office 2,848,610

Patented Aug. 19, 1958

2,848,610

OSCILLATOR FREQUENCY CONTROL APPARATUS

William Leland Freienmuth, Gaithersburg, Md., assignor to Vitro Corporation of America, Verona, N. J.

Application May 25, 1953, Serial No. 356,935

1 Claim. (Cl. 250—36)

My invention relates to oscillator circuitry and more particularly relates to that class of circuitry wherein the frequency of an oscillator is varied in accordance with a variable unidirectional control signal applied to the input of the oscillator.

I have discovered that conventional circuitry of this type is unsatisfactory for applications which require both a high degree of circuit linearity and a high degree of circuit stability over a wide range of operating conditions such as severe changes in ambient temperatures, fluctuations in operating voltages and the like. Specifically, the conventional circuitry does not produce a sufficiently linear frequency variation with changes in the control signal nor does it produce a substantially constant oscillator frequency for a fixed value of control voltage.

Therefore, it is an object of the present invention to provide improved oscillator circuitry of the character indicated.

It is a further object to provide oscillator circuitry which possesses a high degree of circuit linearity.

Still a further object is to provide oscillator circuitry which possesses a high degree of circuit stability.

Another object is to provide oscillator circuitry of the character indicated which includes a frequency stabilization feedback loop.

Still another object is to provide oscillator circuitry which includes a frequency stabilization feedback loop incorporating a stable frequency determining element.

Yet another object is to provide oscillator circuitry to control the frequency of a multivibrator by means of a frequency stabilization feed-back loop which includes a discriminator.

Figure 1:
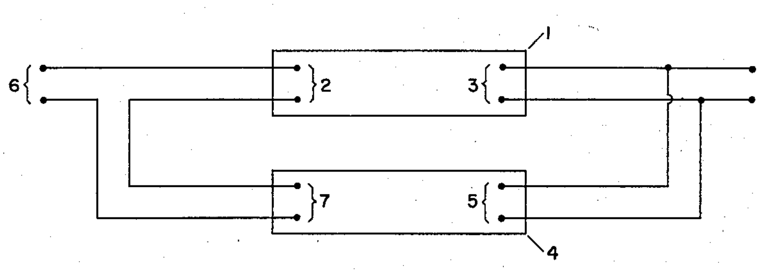
Figure 2:
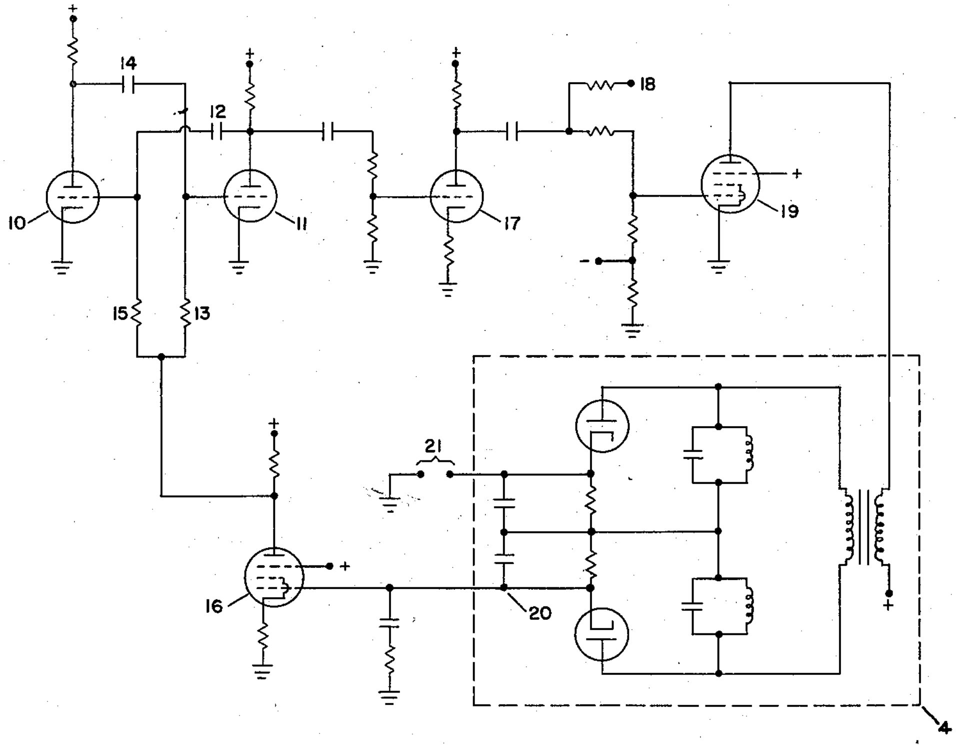

These and other objects of the present invention will be explained or become apparent to those skilled in the art when this specification is read in conjunction with the accompanying drawings wherein:

Figure 1 shows a block form of a preferred embodiment of the present invention; and Figure 2 shows this embodiment in schematic form.

Briefly stated, my invention contemplates an oscillator whose frequency is varied in accordance with a variable unidirectional control signal supplied to its input. Such an oscillator may be, for example, a free running multivibrator. A variable unidirectional control voltage is supplied to the input of the oscillator to control its frequency. In order to provide frequency stabilization, a frequency stabilization feedback loop is connected between the input and output of the oscillator. This loop includes a device which converts oscillator frequency variations into a variable unidirectional feedback voltage and which has great frequency stability. Such a device may be, for example, a discriminator. The feedback and control voltages have opposing polarities. Both voltages are combined into a composite signal (the control signal) which is supplied to the input of the oscillator to control the frequency thereof.

I have also discovered that the linearity limiting circuit element of my system is the oscillator which is inherently non-linear. The discriminator can easily be designed to have excellent linearity within the range of operating conditions that I require. Therefore, in order to obtain the desired range of circuit linearity, the value of the feedback factor (i. e. the product of the oscillator deviation gain in the absence of feedback and the reciprocal of the discriminator deviation gain) is made much greater than unity; in this situation I have discovered that the circuit linearity is substantially independent of the oscillator linearity and is dependent only upon the discriminator linearity.

Referring now to Figure 1, I provide an oscillator 1 having input terminals 2 and output terminals 3. This oscillator is of the type previously discussed. When no unidirectional control signal is applied to input terminals 2, the oscillator generates oscillations at a predetermined control frequency. When such a control signal is applied to terminals 2, the frequency of the oscillator is shifted in a direction which is determined by the polarity of the control signal and the magnitude of the frequency shift is determined by the magnitude of the control signal. Theoretically such an oscillator should generate oscillations of constant frequency for a constant control signal; however, the conventional oscillators of this type are unstable especially when subjected to varying ambient temperatures and varying operation voltages.

I therefore provide a frequency stabilization feedback loop including a device 4 for converting oscillator frequency variations into a variable unidirectional feedback voltage. The input terminals 5 of device 4 (which may, for example, be a discriminator) are connected to corresponding output terminals 3 of oscillator 1.

A control voltage for determining the frequency of oscillation is applied across the system input terminal 6. The feedback voltage from device 4 appears at output terminals 7 and is supplied in series with the control voltage to input terminals 2 of oscillator 1. The polarities of these voltages are chosen so that the polarity of the feedback voltage always opposes the polarity of the control voltage.

I have found that this type of arrangement results in linearity and stability circuit errors which are on the order of 1% as large as the errors which would be present in the absence of the stabilization loop.

In order to explain this quantitative improvement it is necessary to analyze the circuit operation mathematically.

Let $F$=oscillator frequency;
$E_{in}$=the control voltage;
$E_{fb}$=the feedback voltage; and
$E_c$=the input voltage applied at terminals 2.

Furthermore, by definition $$A=\text{deviation gain of the oscillator without feedback}=\frac{\Delta F}{\Delta E_{in}}$$

$$B=\text{feedback developed by discriminator}=\frac{\Delta E_{fb}}{\Delta F}$$

$$\frac{1}{B}=\text{reciprocal of feedback or deviation gain of the discriminator}=\frac{\Delta F}{\Delta E_{fb}}$$

$$A_0=\text{deviation gain of the oscillator with feedback}=\frac{\Delta F}{\Delta E_c}$$

It will be apparent that $$A_0=\frac{A}{1-AB}=-\frac{1}{B}\,\frac{1}{\left(1-\frac{1}{AB}\right)}$$

The signs in the above expression are so chosen that when $E_{in}$ and $E_{fb}$ have opposing polarities (as in this case) B is negative.

The quantity (AB) I define as the feedback factor. This factor is equal to the product of the oscillator deviation gain in the absence of feedback and the feedback developed by the discriminator (i. e., the reciprocal of the deviation gain). When the feedback factor is much greater than unity, the above expression becomes essentially $$A_0=\frac{1}{B}$$

In other words, the deviation gain of the oscillator in the presence of feedback approximately equals the deviation gain of the discriminator and consequently depends only on the characteristics of the discriminator and is independent of the oscillator characteristics.

It will be apparent from the foregoing that for a large feedback factor when the discriminator is highly stable, the entire system will be highly stable despite any oscillator instabilities which may be present.

Moreover, if the discriminator can be made linear over the desired frequency control range of the system, the nonlinearity of the system is reduced by the factor $(1-AB)$. Thus for a large feedback factor, the linearity of the system can be made essentially equal to that of the discriminator.

Figure 2 shows schematically the system described in Figure 1. Valves 10 and 11 are connected together to form a balanced free running multivibrator of the well known type which generates a square wave signal whose central frequency is determined by the time constants of the resistance capacitance networks, 15, 12 and 13, 14 included in the grid circuit of each valve and whose frequency is shifted above or below this central frequency in accordance with a variable unidirectional control signal appearing at the anode of valve 16 and applied to the junction of resistors 13 and 15.

The oscillator output signal appears at the anode of valve 11 and is applied to the grid of valve 17. Valve 17 is connected as a grid and plate limited amplifier and functions as a limiter, yielding at its anode a signal whose frequency is determined by the oscillator and whose amplitude does not vary as the frequency of the oscillator is changed. The limited signal is supplied to output terminal 18 and is also supplied to the grid of valve 19.

Valve 19 is a power amplifier which drives a discriminator of conventional type identified generally at 4. The discriminator derives from the amplified limited signal a variable unidirectional voltage (the feedback voltage) whose magnitude is proportional to the amount the oscillator frequency is shifted with respect to the central frequency and whose direction is determined by the direction in which the frequency is shifted. This feedback voltage appears at an output terminal 20 of the discriminator. A variable unidirectional control voltage is applied between the pair of terminals 21 of discriminator 4.

This unidirectional control signal representing the sum of the feedback and control voltages appears at the output terminal 20 of the discriminator 4. As will be apparent from the circuitry disclosed, these two voltages always have opposing polarities at the initial operating conditions of the circuitry. Of course, if the system operates with relatively small control signals, a relatively large variation in the oscillator frequency due to temperature or other effects may tend to shift the frequency of operation to the other side of the discriminator center frequency. However, the voltage resulting from combining the feedback and control voltages practically instantaneously corrects for such effects.

The control signal is applied to the grid of valve 16. Valve 16 is connected as a direct current amplifier so that an amplified variable unidirectional control signal appears at the anode of valve 16 and is used to control the oscillator frequency.

While I have shown and described and pointed out the fundamental novel features of the invention as applied to a preferred embodiment, it will be understood that various omissions, substitutions and changes in the form and details of this embodiment may be made by those skilled in the art without departing from the spirit of the invention. It is my intention, therefore, to be limited only as indicated by the scope of the claim that follows.

I claim:

Oscillator control circuits comprising a free running multivibrator including two electron discharge tubes having their plates cross-coupled by capacitors to their respective control electrodes, a pair of resistors each respectively connected to one of the control electrodes and to a common input terminal, the multivibrator being subject to random frequency variations and having a first predetermined frequency deviation gain in the absence of feedback, said multivibrator varying its frequency from a selected free running frequency in response to unidirectional voltage applied to the input terminal, a discriminator having a second predetermined frequency deviation gain, an amplitude limiter and power amplifier coupling the output of the oscillator to the input of the discriminator, said discriminator having a center frequency substantially the same as the free running frequency of the oscillator and producing a variable magnitude unidirectional feedback voltage at its output in response to variations in said oscillator frequency, the product of said first gain and the reciprocal of said second gain having a value greatly in excess of unity, a direct current amplifier tube having its control electrode coupled to the discriminator output, a unidirectional control signal source, a pair of terminals connected in series with the discriminator output and the direct current amplifier control electrode, said terminals receiving the unidirectional control signal, and conductive means connecting the direct current amplifier output to the input terminal of the multivibrator for applying a composite unidirectional control voltage formed of the control signal and feedback signal to the input terminal to vary the oscillator frequency linearly from the selected frequency in accordance with changes in the control signal and to correct the random frequency variations.

References Cited in the file of this patent

UNITED STATES PATENTS

| | | |
|---|---|---|
| 2,426,996 | Goodall | Sept. 9, 1947 |
| 2,434,294 | Ginzton | Jan. 13, 1948 |
| 2,438,425 | Vance | Mar. 23, 1948 |
| 2,456,763 | Ziegler | Dec. 21, 1948 |
| 2,461,871 | Bass | Feb. 15, 1949 |
| 2,492,090 | Bass | Dec. 20, 1949 |
| 2,510,095 | Frankel | June 6, 1950 |
| 2,526,353 | Harralson | Oct. 17, 1950 |
| 2,531,301 | Scholten | Nov. 21, 1950 |
| 2,545,296 | Mittelmann | Mar. 13, 1951 |
| 2,593,463 | Kinzer | Apr. 22, 1952 |
| 2,610,298 | Zaloudek | Sept. 9, 1952 |
| 2,720,591 | Hupert | Oct. 11, 1955 |

FOREIGN PATENTS

| | | |
|---|---|---|
| 546,168 | Great Britain | June 30, 1942 |
| 626,595 | Great Britain | July 18, 1949 |